United States Patent [19]
Hsu

[11] Patent Number: 6,165,901
[45] Date of Patent: Dec. 26, 2000

[54] METHOD OF FABRICATING SELF-ALIGNED CONTACT

[75] Inventor: Chen-Chung Hsu, Taichung, Taiwan

[73] Assignee: United Microelectronics Corp., Hsinchu, Taiwan

[21] Appl. No.: 09/199,970

[22] Filed: Nov. 25, 1998

[51] Int. Cl.[7] .................................................. H01L 21/336
[52] U.S. Cl. ........................ 438/652; 438/653; 438/659; 438/584
[58] Field of Search ..................................... 438/584, 652, 438/653, 659

[56] References Cited

U.S. PATENT DOCUMENTS 5,899,722  5/1999  Huang ...................................... 438/305

*Primary Examiner*—Charles Bowers
*Assistant Examiner*—Lisa Kilday
*Attorney, Agent, or Firm*—Hickman Coleman & Hughes, LLP

[57] ABSTRACT

A method of fabricating a self-aligned contact forms at least a gate and a source/drain region on a substrate, wherein a cap layer is formed on top of the gate. First spacers are formed on sidewalls of the gate. Second spacers are formed to cover the first spacers and the source/drain region. A dielectric layer having an opening is formed over the substrate. A portion of the second spacers is exposed by the opening. The second spacers exposed by the opening are removed to form a concave region. The source/drain region is exposed by the concave region. A plug that can be electrically coupled to the source/drain region is formed in the opening and the concave region.

16 Claims, 5 Drawing Sheets

METHOD OF FABRICATING SELF-ALIGNED CONTACT

BACKGROUND OF THE INVENTION

1. Field of Invention

The present invention relates to a method of fabricating a metal oxide semiconductor (MOS) transistor. More particularly, the present invention relates to a method for fabricating a self-aligned contact (SAC).

2. Description of Related Art

In a conventional method of fabricating a self-aligned contact (SAC), an insulating layer is formed on the sidewalls and top of a polysilicon gate on a substrate in order to serve as spacers. The spacers can protect the gate from being damaged during a step of forming a contact hole formed subsequently. Moreover, the spacers can provide a self-aligning function for the contact hole formed subsequently. An inter-layer dielectric (ILD) layer is formed over the substrate to cover the polysilicon gate. The ILD layer is defined to form a self-aligned contact hole. The self-aligned contact hole is filled with a polysilicon layer or a tungsten layer. A self-aligned contact is completely formed.

According to a design rule, before defining the ILD layer to form the contact hole, the conventional method is to reserve more space around the contact hole in order to avoid misalignment, leading to a decrease of contact area between the contact and the source/drain region. In order to increase the integration of devices, a borderless contact is normally used to efficiently reduce the size of device.

While forming a self-aligned borderless contact hole, if misalignment occurs, contact area between the contact and the source/drain region is reduced, that leads to increasing contact resistance between the contact and the source/drain region.

FIGS. 1A through 1E are schematic, cross-sectional views showing a conventional method of fabricating a self-aligned contact.

Referring to FIG. 1A, a P-type semiconductor substrate 100 is provided. A gate 102 is formed on the substrate 100. The steps of forming the gate 102 includes forming a gate oxide layer 104 on the substrate 100, forming a stacked conductive layer 106 on the gate oxide layer 104 and forming a cap layer 108 on the stacked conductive layer 106. The steps of forming the stacked conductive layer 106 includes forming a doped polysilicon layer (not shown) on the gate oxide layer 104 and forming a silicide layer (not shown) on the doped polysilicon layer. A lightly doped source/drain region 110 is formed by implanting N-type arsenic ions or phosphorus ions into the substrate 100, using the gate 102 as a mask.

Referring to FIG. 1B, a conformal insulating layer 114 is formed over the substrate 100 by chemical vapor deposition (CVD).

Referring to FIG. 1C, the insulating layer 114 is defined by photolithography and etching. A part of the insulating layer 114 on the substrate 100 is removed by an anisotropic etching method while the remaining part of the insulating layer 114 covers the surface of the gate 102. As shown in FIG. 1C, the remaining part of the insulating layer 114 is on the sidewalls and the top of the gate 102 to serve as spacers 114a. Due to the formation of the spacers 114a, a contact hole 115 having a self-aligning function is formed above the lightly doped source/drain region 110. The spacers 114a not only serve as protection for the gate 102, but also serve as a mask in the formation of heavily doped source/drain regions. Then, an ion implantation with heavily doped ions is performed to form a heavily doped source/drain region onto the substrate 100. A source/drain region 116 having a lightly doped drain (LDD) structure is thus formed.

Referring to FIG. 1D, a dielectric layer 120 is formed over the substrate 100 to cover the gate 102 by CVD.

The dielectric layer 120 is defined to form a contact hole 122 in the dielectric layer 122 by photolithography and etching. The source/drain region 116, which is normally below the expected contact hole 115, is exposed. However, the contact hole 122 is easily misaligned during the step of defining the dielectric layer 120. If misalignment occurs, the contact hole 122 is not completely aligned to the source/drain region 116. Only a portion of the spacers 114a and a portion of the source/drain region 116 are exposed by the misaligned contact hole 122. Thus, contact resistance between the source/drain region 116 and a plug formed subsequently is increased. If the misalignment occurs more seriously, an open condition caused by no contact between the contact and the source/drain region 116 occurs.

Referring to FIG. 1E, a plug 124 is formed in the contact hole 122 in the dielectric layer 120. The step of forming the plug 124 includes forming a glue/barrier layer (not shown) along the contact hole 122, in order to increase adhesion between a conductive layer formed subsequently and other material on the substrate 100. The glue/barrier layer includes titanium/titanium nitride (Ti/TiN) or tantalum/tantalum nitride (Ta/TaN). A conductive layer, such as a tungsten layer, is formed over the substrate 100 to fill the contact hole 122. The part of the conductive layer on the dielectric layer 120 is removed until the dielectric layer 120 is exposed by chemical mechanical polishing (CMP). Thus, the plug 124 is formed in the contact hole 122 and the plug 124 is electrically coupled to the source/drain region 116.

In the conventional method of forming the contact hole 122, misalignment easily occurs while forming the contact hole 122. The misalignment causes only a portion of the source/drain region 116 to be exposed by the contact hole 122. Therefore, contact resistance between the source/drain region 116 and the plug 124 formed is increased. If the misalignment is more serious, even an open condition caused by no contact between the contact and the source/drain region 116 occurs.

SUMMARY OF THE INVENTION

Accordingly, the present invention provides a method of fabricating a self-aligned contact (SAC). A whole source/drain region can be exposed if a contact hole is misaligned. Therefore, contact area between the source/drain region and a plug formed subsequently is increased. Contact resistance between the plug and the source/drain region is thus decreased.

To achieve these and other advantages and in accordance with the purpose of the invention, as embodied and broadly described herein, the invention provides a method of fabricating a SAC. At least a gate and a source/drain region are formed on a substrate, wherein a cap layer is formed on top of the gate. First spacers are formed on sidewalls of the gate. Second spacers are formed to cover the first spacers and the source/drain region. A dielectric layer having an opening is formed over the substrate. The second spacers are exposed by the opening. The second spacers exposed by the opening are removed to form a concave region. The source/drain region is exposed by the concave region. A plug that can be electrically coupled to the source/drain region is formed in the opening and the concave region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
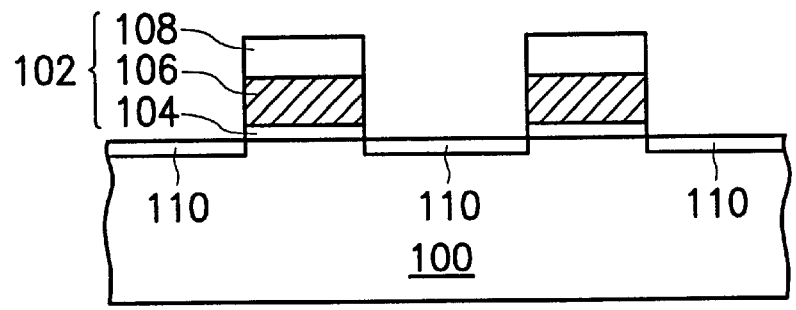
FIGS. 1A through 1E are schematic, cross-sectional views showing a conventional method of fabricating a self-aligned contact.
Figure 1B:
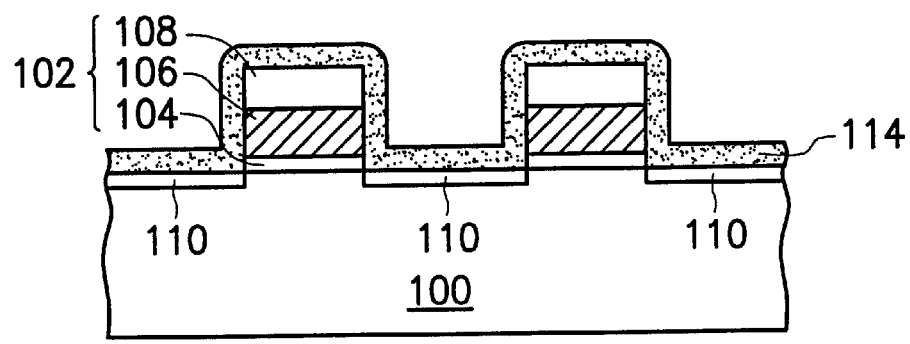
Figure 1C:
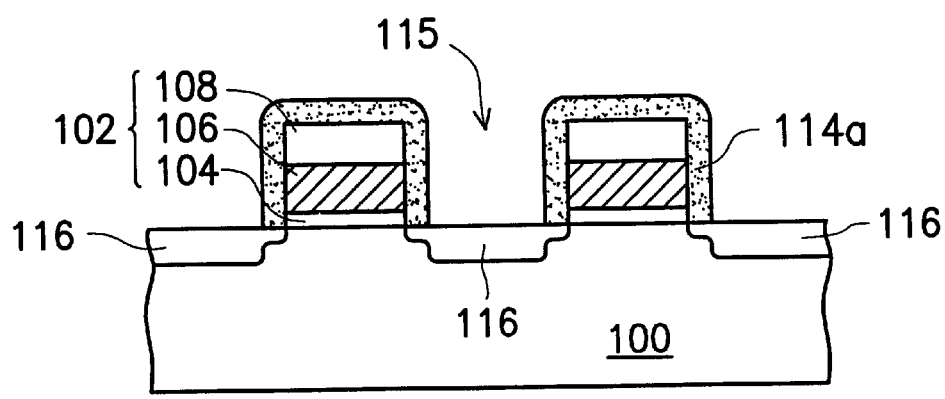
Figure 1D:
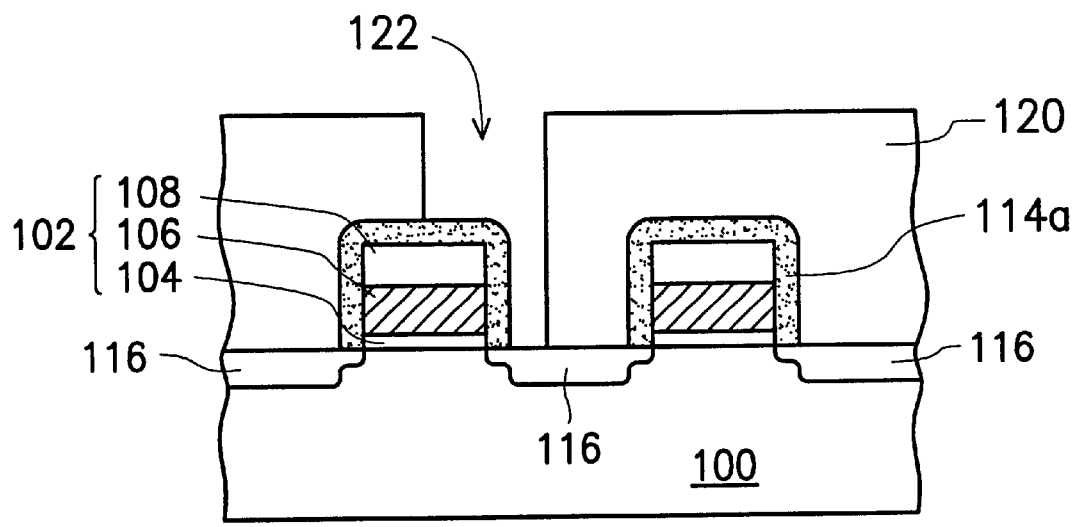
Figure 1E:
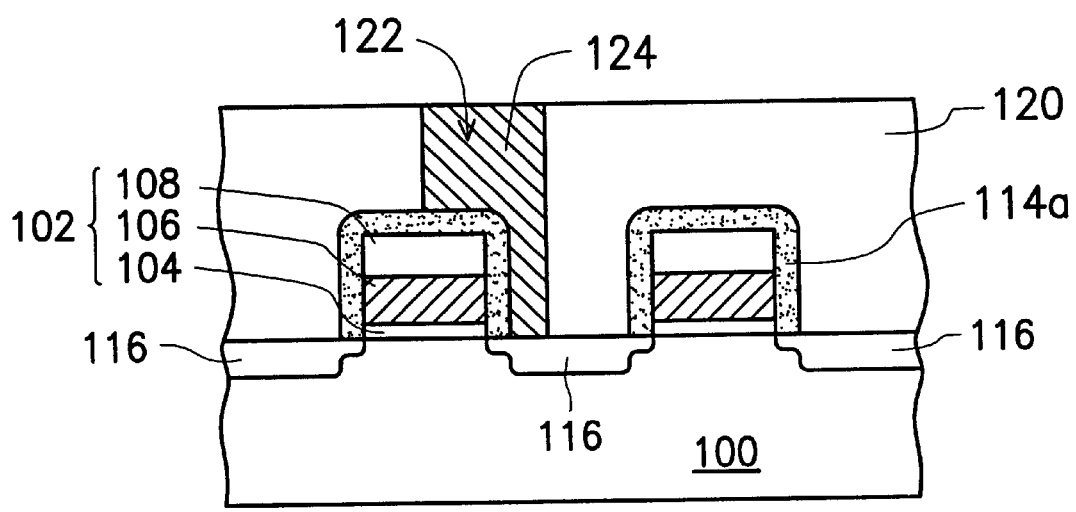

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through FIG. 2G are schematic, cross-sectional views showing a method of fabricating a self-aligned contact according to the preferred embodiment of the invention.

Figure 2A:
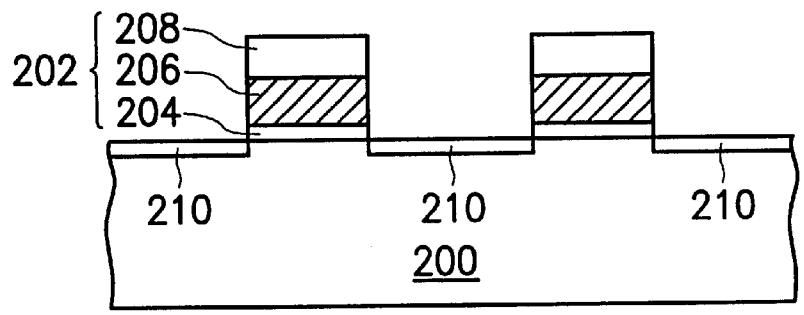
FIG. 2A through FIG. 2G are schematic, cross-sectional views showing a method of fabricating a self-aligned contact according to the preferred embodiment of this invention.

Referring to FIG. 2A, a semiconductor substrate 200 is provided. The substrate 200 can be, for example, a P-type substrate or an N-type substrate having a lightly doped P-type well. A gate 202 is formed on the substrate 200. Forming the gate 202 includes, for example, forming a gate oxide layer 204 on the substrate 200, forming a stacked conductive layer 206 on the gate oxide layer 204 and forming a cap layer 208 on the stacked conductive layer 206. The gate oxide layer 204 is formed, for example, in an atmosphere of oxygen, and the operating temperature ranges from about 800° C. to about 1000° C. Forming the stacked conductive layer 206 includes, for example, forming a doped polysilicon layer (not shown) on the gate oxide layer 204 and forming a silicide layer (not shown) on the doped polysilicon layer. Forming the doped polysilicon layer includes, for example, forming a doped polysilicon layer over the substrate 200 by low pressure CVD (LPCVD). Dopant ions such as arsenic ions or phosphorus ions are commonly used. The method of doping ions in the polysilicon layer includes, for example, doping ions while forming the polysilicon layer, or implanting ions after forming the polysilicon layer. The silicide layer of the stacked conductive layer 206 includes, for example, a tungsten silicide layer, a titanium silicide layer or a molybdenum silicide layer. The forming step of the cap layer 208 includes, for example, forming a silicon oxide layer by CVD. The cap layer 208 serves as an etching buffer layer for a contact hole formed subsequently, so that it can avoid over etching and protect the stacked conductive layer 206 of the gate 202 from being damaged. A lightly doped source/drain region 210 is formed by implanting ions, such as N-type arsenic ions or phosphorus ions, into the substrate 200 using the gate 202 as a mask.

Figure 2B:
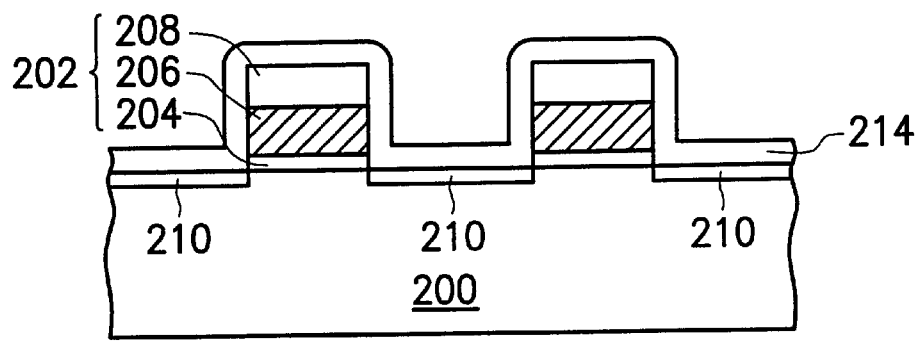

Referring to FIG. 2B, a conformal insulating layer 214, such as a silicon oxide layer, is formed over the substrate 200, for example, by chemical vapor deposition(CVD).

Figure 2C:
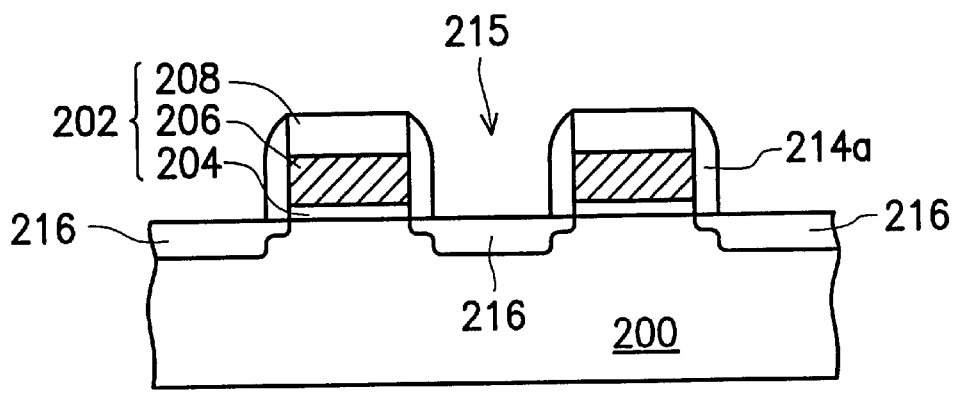

Referring to FIG. 2C, the insulating layer 214 is etched back until a portion of the lightly doped source/drain region 210 is exposed, for example, by an anisotropic etching method, so that spacers 214a are formed on sidewalls of the gate 202. Simultaneously, a contact hole 215 having a self-aligning function is formed above the lightly doped source/drain region 210 due to the formation of the spacers 214a. The lightly doped source/drain region 210 is exposed by the contact hole 215. The spacers 214a not only serve as a protection of the gate 202, but also serve as a mask in the formation of heavily doped source/drain regions. Then, an ion implantation with heavily doped ions, such as N-type arsenic ions, is performed to form a heavily doped source/drain region. A source/drain region 216 having a lightly doped drain (LDD) structure is thus formed.

Figure 2D:
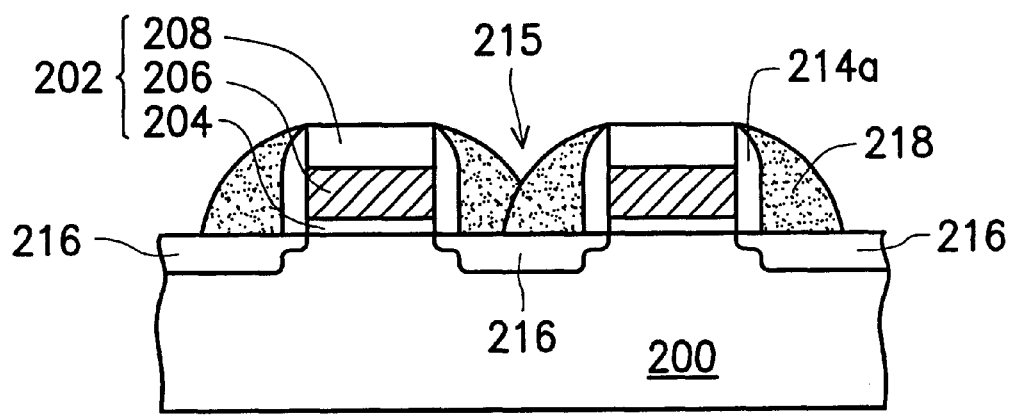

Referring to FIG. 2D, a conformal insulating layer, such as a silicon nitride layer, is again formed over the substrate 200 by a method similar to the above-mentioned method of forming the spacers 214a, for example, a CVD method. The conformal insulating layer at least covers the gate 202 and the spacers 214a.

The insulating layer is etched back to form (outer) spacers 218 on the (inner) spacers 214a by, for example an anisotropic etching method. The (outer) spacers 218 and the (inner) spacers 214a are formed as twin spacers. The material of the (outer) spacers 218 is different from the material of the (inner) spacers 214a. The (outer) spacers 218 at least cover the source/drain region 216 between the two neighboring gates 202.

Figure 2E:
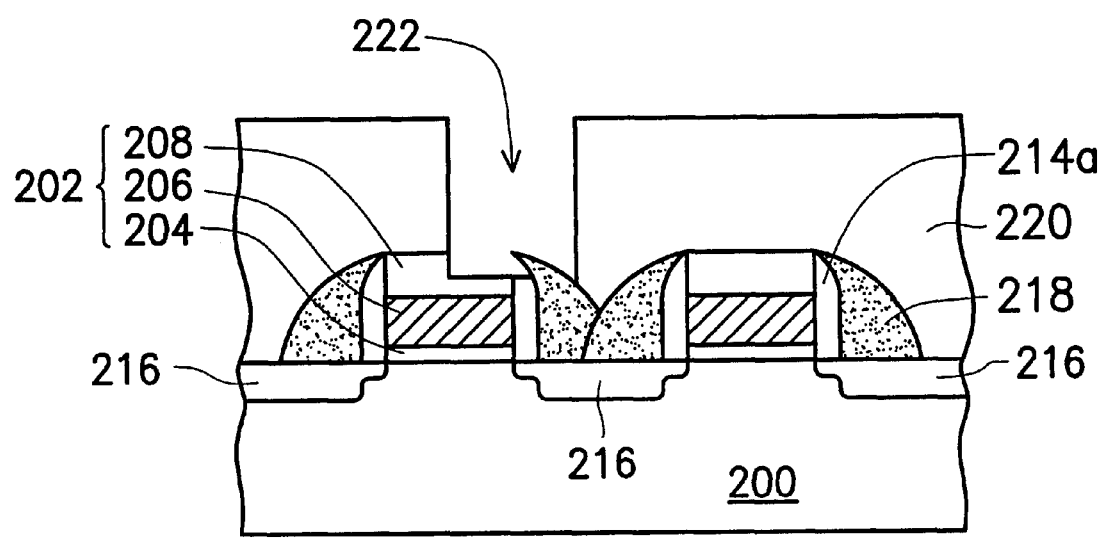

Referring to FIG. 2E, a dielectric layer 220, such as a silicon oxide layer, is formed over the substrate 200, for example, by CVD.

The dielectric layer 220 is defined to form a contact hole in the dielectric layer 220 by photolithography and etching. If the contact hole is aligned, the source/drain region 216 is completely exposed after anisotropic etching. However, the contact hole is easily misaligned while defining the dielectric layer 220. If the misalignment occurs, a contact hole 222 is formed between the two neighboring gate 202, so that portions of the thick cap layer 208 and the spacers 214a are removed to expose a portion of the spacers 214a, the cap layer 208 and the spacers 218.

Figure 2F:
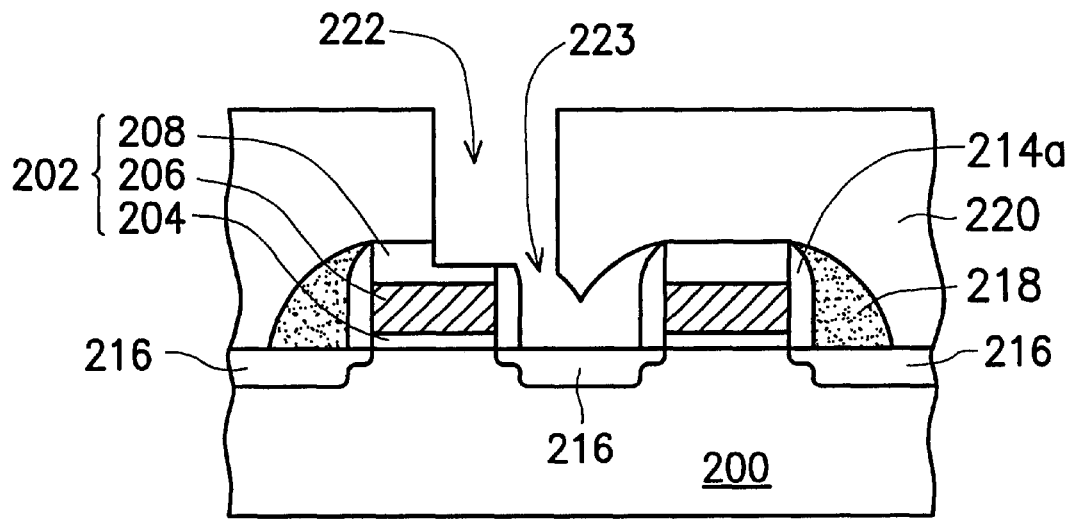

Referring to FIG. 2F, the spacers 218 exposed by the contact hole 222 are removed, for example, by a wet etching method, choosing hot phosphorus acid or other etching solution that can selectively remove the spacers 218 as an etchant. Due to different material of the (inner) spacers 214a and the (outer) spacers 218, after the spacers 218 is removed, a concave region 223, which is a free space previously occupied by the spacers is formed between the contact hole 222 and the substrate 200 by the above-mentioned etching process. The whole source/drain region 216 between the two neighboring gates 202 can be exposed by the concave region 223. Since the whole source/drain region 216 is exposed by the concave region 223 after the etching process, a contact plug formed subsequently can be electrically coupled to the whole source/drain region 216. Therefore, it can improve the misalignment that would cause an increase of contact resistance between the contact plug and the source/drain region 216 while forming the contact hole 222 in the conventional method.

Figure 2G:
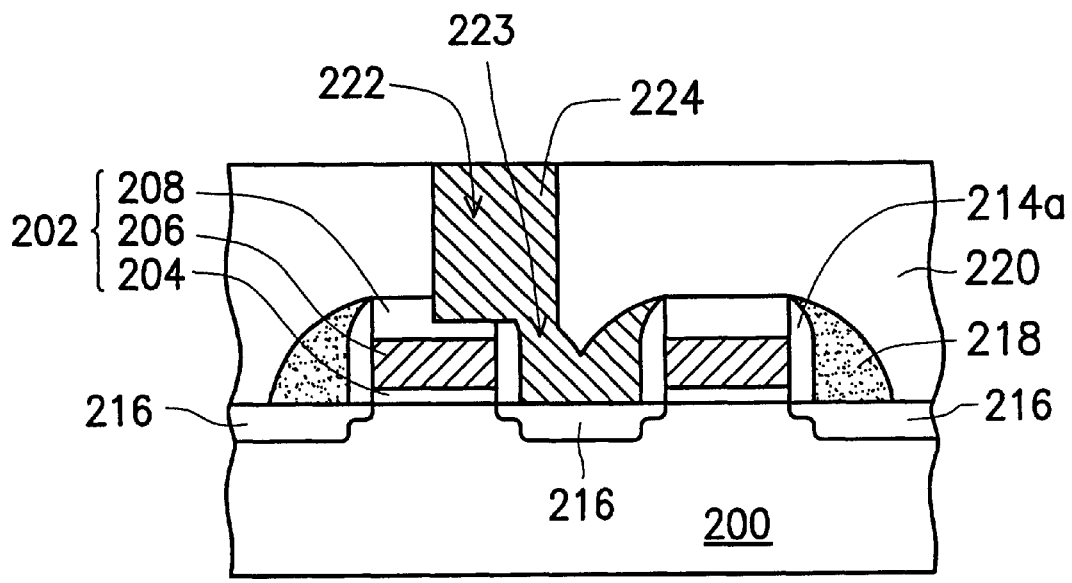

Referring to FIG. 2G, a plug 224 is formed over the concave region 223 and the contact hole 222 in the dielectric layer 220. The step of forming the plug 224 includes, for example, forming a glue/barrier layer (not shown) along the contact hole 222 and the concave region 223, in order to increase adhesion between a conductive layer formed subsequently and other material on the substrate 200. The glue/barrier layer includes, for example, titanium/titanium nitride (Ti/TiN) or tantalum/tantalum nitride (Ta/TaN). A conductive layer, such as a tungsten layer, is formed over the substrate 200 to fill the contact hole 222 and the concave region 223, for example, by deposition. The conductive layer on the dielectric layer 220 is removed until the dielectric layer 220 is exposed, for example, by a chemical mechanical polishing (CMP) method or an etching back method. Thus, the plug 224 electrically coupled to the source/drain region 216 is formed in the contact hole 222 and the concave region 223.

In summary, features of the invention include:

1. The thick cap layer is formed on the top of the gate in the invention. The cap layer can serve as an etching buffer layer while forming a contact hole, so that the over-etching can be avoided and the stacked conductive layer of the gate is protected from being damaged.

2. In the invention, a twin spacer is formed on the sidewalls of the gate. The material of the outer spacers is different from the material of the inner spacers. The outer spacers cover the whole source/drain region, therefore, the source/drain region is exposed by the concave region after the outer spacers are removed. Thus, the contact plug can be electrically coupled to the whole source/drain region in the later process. Therefore, it can improve the misalignment which would cause an increase of contact resistance between the contact plug and the source/drain region while forming the contact hole.

3. The self-aligned contact is fabricated using standard semiconductor equipment and processes, and hence the invention can be incorporated quite easily into a conventional semiconductor production line.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a self-aligned contact in a semiconductor substrate, comprising:

forming at least a gate and a source/drain region on the substrate wherein a cap layer is formed on top of the gate;

forming first spacers on sidewalls of the gate;

forming second spacers on the first spacers and the source/drain region;

forming a dielectric layer over the substrate;

forming an opening in the dielectric layer, wherein the opening exposes parts of the cap layer, the first spacer, and the second spacers when a misalignment occurs in the step of forming an opening;

removing the second spacers exposed by the opening to form a concave region exposing the source/drain region;

forming a conductive layer over the dielectric layer to fill the opening and the concave region;

removing the conductive layer on the dielectric layer until the dielectric layer is exposed; and forming a plug in the opening and the concave region, the plug electrically coupled to the source/drain region.

2. A method according to the claim 1, wherein material of the cap layer comprises silicon oxide.

3. A method according to the claim 1, wherein material of the first spacers comprises silicon oxide.

4. A method according to the claim 1, wherein the step of forming the first spacers comprises:

forming a conformal insulating layer over the substrate to cover the gate; and etching back the insulating layer to form the first spacers on the sidewalls of the gate.

5. A method according to claim 1, wherein material of the second spacers comprises silicon nitride.

6. A method according to claim 1, wherein the step of forming the second spacers comprises:

forming a conformal insulating layer over the substrate to at least cover the gate and the first spacers; and etching back the insulating layer to form the second spacers on the sidewalls of the first spacers.

7. A method according to claim 1, wherein material of the dielectric layer comprises silicon oxide.

8. A method according to claim 1, wherein the step of removing the second spacers exposed by the opening comprises a wet etching method.

9. A method of fabricating a self-aligned contact in a semiconductor substrate, wherein at least a gate and a source/drain region is formed on the substrate, a cap layer is formed on top of the gate and the source/drain region lies in the substrate beside the gates, comprising the steps of:

forming first spacers on sidewalls of the gate;

forming second spacers for covering the first spacers and the source/drain region;

forming a dielectric layer having an opening over the substrate wherein the the opening exposes parts of the cap layer, the first spacer, and the second spacers;

removing the second spacers exposed by the opening to form a concave region until the source/drain region is exposed; and forming a plug in the opening and the concave region that is electrically coupled to the source/drain region.

10. A method according to claim 9, wherein material of the first spacers comprises silicon oxide.

11. A method according to claim 9, wherein the step of forming the first spacers comprises:

forming a conformal insulating layer over the substrate to cover the gate; and etching back the insulating layer to form the first spacers on the sidewalls of the gate.

12. A method according to claim 9, wherein material of the second spacers comprises silicon nitride.

13. A method according to claim 9, wherein the step of forming the second spacers comprises:

forming a conformal insulating layer over the substrate to at least cover the gate and the first spacers; and etching back the insulating layer to form the second spacers on the sidewalls of the first spacers.

14. A method according to claim 9, wherein material of the dielectric layer comprises silicon oxide.

15. A method according to claim 9, wherein the step of removing the second spacers exposed by the opening comprises a wet etching method.

16. A method according to claim 9, wherein the step of forming the plug comprises:

forming a conductive layer over the dielectric layer to fill the opening and the concave region;

removing the conductive layer on the dielectric layer until the dielectric layer is exposed; and forming a plug that is electrically coupled to the source/drain region in the opening and the concave region.

* * * * *